United States Patent

Todokoro et al.

[11] Patent Number: 5,389,787
[45] Date of Patent: Feb. 14, 1995

[54] SCANNING ELECTRON MICROSCOPE

[75] Inventors: Hideo Todokoro, Tokyo; Tadashi Otaka, Katsuta, both of Japan

[73] Assignee: Hitachi, Ltd., Tokyo, Japan

[21] Appl. No.: 137,976

[22] Filed: Oct. 19, 1993

[30] Foreign Application Priority Data

Oct. 20, 1992 [JP] Japan .................................. 4-306205

[51] Int. Cl.⁶ .......................................... H01J 31/256
[52] U.S. Cl. ................................ 250/310; 250/441.11
[58] Field of Search ............................ 250/310, 441.1

[56] References Cited

U.S. PATENT DOCUMENTS 3,714,425 1/1973 Someya et al. .
3,736,422 5/1973 Weber et al. ................. 250/310
3,792,263 2/1974 Hashimoto et al. ........... 250/310

FOREIGN PATENT DOCUMENTS 56-048044 5/1981 Japan .
1115042 5/1989 Japan .
2142045 5/1990 Japan .
3071544 3/1991 Japan .

OTHER PUBLICATIONS

IEEE 9th Annual Symposium on Electron, Ion and Laser Technology, pp. 176-186.

*Primary Examiner*—Jack I. Berman
*Attorney, Agent, or Firm*—Antonelli, Terry, Stout & Kraus

[57] ABSTRACT

In a scanning electron microscope with such a structure that a retarding static field for an electron beam is produced between an objective lens and a sample, when the following three conditions can be satisfied, a switch for applying a superimposed voltage is closed to apply the superimposed voltage to the sample. In the first condition, a switch for applying an acceleration voltage is closed and the acceleration voltage 5 is applied. In the second condition, both of a valve and a valve are opened which are provided between a cathode and the sample. In the third condition, when the sample is mounted on a sample stage by a sample replacing mechanism 57, a valve through which the sample passes is closed. The sample stage is electrically connected via a discharge resistor to a sample holder, and when the switch is opened, electric charges charged on the sample are discharged through the sample holder and the sample stage. As a result, when the sample is mounted/released onto/from the sample stage, the application of the voltage to the sample is automatically interrupted.

12 Claims, 9 Drawing Sheets

SCANNING ELECTRON MICROSCOPE

CROSS-REFERENCE TO RELATED APPLICATION

The present invention relates to a subject matter described in application Ser. No. 08/034,373 filed on Mar. 18, 1993, entitled "A SCANNING ELECTRON MICROSCOPE AND METHOD FOR CONTROLLING A SCANNING ELECTRON MICROSCOPE" by Tadashi OTAKA, the disclosure of which is hereby incorporated by reference.

BACKGROUND OF THE INVENTION

The present invention generally relates to a scanning electron microscope for obtaining a scanning image by scanning an electron spot on a sample, and particularly to a scanning electron microscope capable of obtaining a scanning image with high spatial resolution within a low acceleration voltage region.

A scanning electron microscope has been conventionally used for observation and a length-measurement of submicron-order (1 micron or less), such as contact holes and line patterns in a semiconductor device sample.

The scanning electron microscope obtains a scanning image (SEM image) by scanning an electron beam emitted from a heating type or field emission type electron source on a sample to detect secondary particles such as secondary electrons and back scattered electrons as detection signals, and using the detection signals for the brightness modulation input for a cathode ray tube scanned synchronously with the electron beam scanning. In typical scanning electron microscopes, electrons emitted from an electron source are accelerated between the electron source to which a negative potential is being applied and an anode connected to the ground potential. The accelerated electrons are focused on the sample connected to the ground potential.

Very recently, scanning electron microscopes have been used in manufacturing process and inspections of semiconductor devices. For this purpose, a need has arisen for achieving high resolution below 10 nm with employment of such a low acceleration voltage less than 1,000 V in order to observe an insulating material without any charging-up effect.

That is, a semiconductor device sample is generally made by forming an electrical insulator such as $SiO_2$ or SiN on a conductive portion of Al or Si. When an electron beam is applied to the semiconductor device sample, the surface of the electrical insulation is negatively electrified (hereafter may be expressed simply as "changing-up"), orbit of the emitted electrons is changed, and orbit of the primary electrons per se is changed. As a result, abnormal contrast or distortion may occur in the SEM (scanning electron microscope) image.

The above image interference due to charging-up seriously affects the observation of contact holes and the length-measurement of lines-and-spaces. Therefore, this makes it difficult to not only evaluate semiconductor manufacturing processes, but also assure the quality of semiconductor devices. For this reason, a so-called low voltage acceleration SEM has been conventionally used in which the energy of the primary electron beam which scans on a sample is 1 keV or lower.

However, the above-described prior art owns the following various problems. That is, if the acceleration voltage would become lower, observation at a high magnification would become difficult because the resolution is extremely degraded due to increase of chromatic aberration caused by energy spread of electron beams. If electron current would decrease, the ratio of secondary signal to noise (S/N) would extremely decrease, the contrast of an SEM image is impaired, and observation at high magnification and resolution would become difficult. Especially, for a semiconductor device made by an ultra-fine processing technique, signals generated from recessed portions of contact holes and line patterns become weak. Therefore, this makes fine observation and length-measurement very difficult.

To solve such a problem, some methods have been proposed. For instance, in accordance with proceeding of IEEE 9th Annual Symposium on Electron, Ion and Laser Technology, pages 176 to 186, the acceleration voltage applied between the electron source and the anode biased at the ground potential is set to the high value, and the retarding static field is produced between the objective lense biased at the ground potential and the inspection sample to which the negative potential is applied, so that the electron beams irradiated to the sample are decelerated. Thus, the acceleration voltage is eventually set to a relatively low voltage, and such a scanning electron microscope is proposed that both chromatic aberration can be reduced and the charging-up can be prevented.

Nevertheless, since the applications of negative potentials to the sample are manually performed by operators in this prior art scanning electron microscope, there are some possibilities that a shortcircuit happens to occurs between the sample and the ground potential when operators would forget to cut off the application of negative potentials to the sample during substitution of the sample. Moreover, there are possibilities that samples such as semiconductor devices which are readily, adversely influenced by electric damages may be destroyed due to sudden potential changes caused by the shortcircuit. As a consequence, there are various problems. That is, a careful operation is required when the voltage application is turned ON/OFF while the sample is mounted and replaced in the scanning electron microscope, i.e., a difficult handling of the sample is needed.

SUMMARY OF THE INVENTION

An object of the present invention has been made to solve the above-described conventional problems, and therefor to provide a scanning electron microscope capable of easily mounting and relating a sample with respect to such a scanning electron microscope that a retarding static field for electron beams is produced between an objective lens and the sample.

To achieve the above-explained object, according to the present invention, in a scanning electron microscope wherein primary electron beams emitted from an electron source are scanned on a sample, and a scanning image is obtained from a detection signal produced by secondary particles generated from the sample, there are provided:

means for detecting the secondary particles generated from a surface of the sample on the side of the electron source separated from an objective lens;

means for producing a retarding static field with respect to the primary electron beams between the sample and the objective lens by applying a negative voltage to the sample; and means for controlling an application of the negative voltage to the sample in conjunction with a preparation operation for mounting and replacing the sample.

With the above-described arrangement, since the application of negative voltage to the sample is controlled in conjunction with the preparation operation for mounting and replacing the sample, operators can mount and replace the sample without paying their specific attentions to the application of negative voltage to the sample, resulting in very easy handling.

BRIEF DESCRIPTION OF THE DRAWINGS

For a more complete understanding of the present invention, and the advantages thereof, reference is now made of the following descriptions taken in conjunction with the accompanying drawings, in which.

DESCRIPTION OF THE PREFERRED EMBODIMENTS

Referring now to drawings, the present invention will be described in detail.

Figure 1:
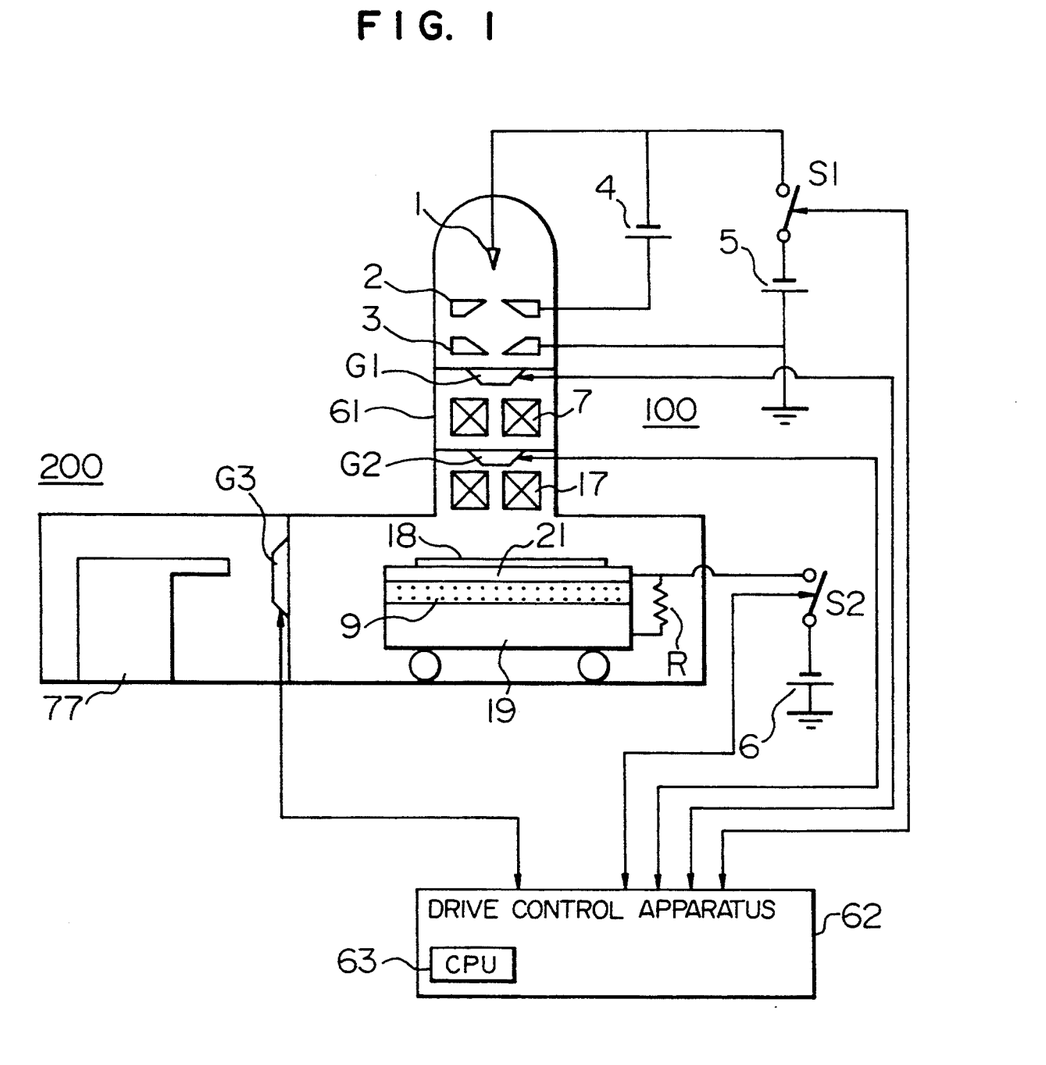
FIG. 1 is a schematic structural diagram of a scanning electron microscope according to a first embodiment of the present invention.
Figure 2:
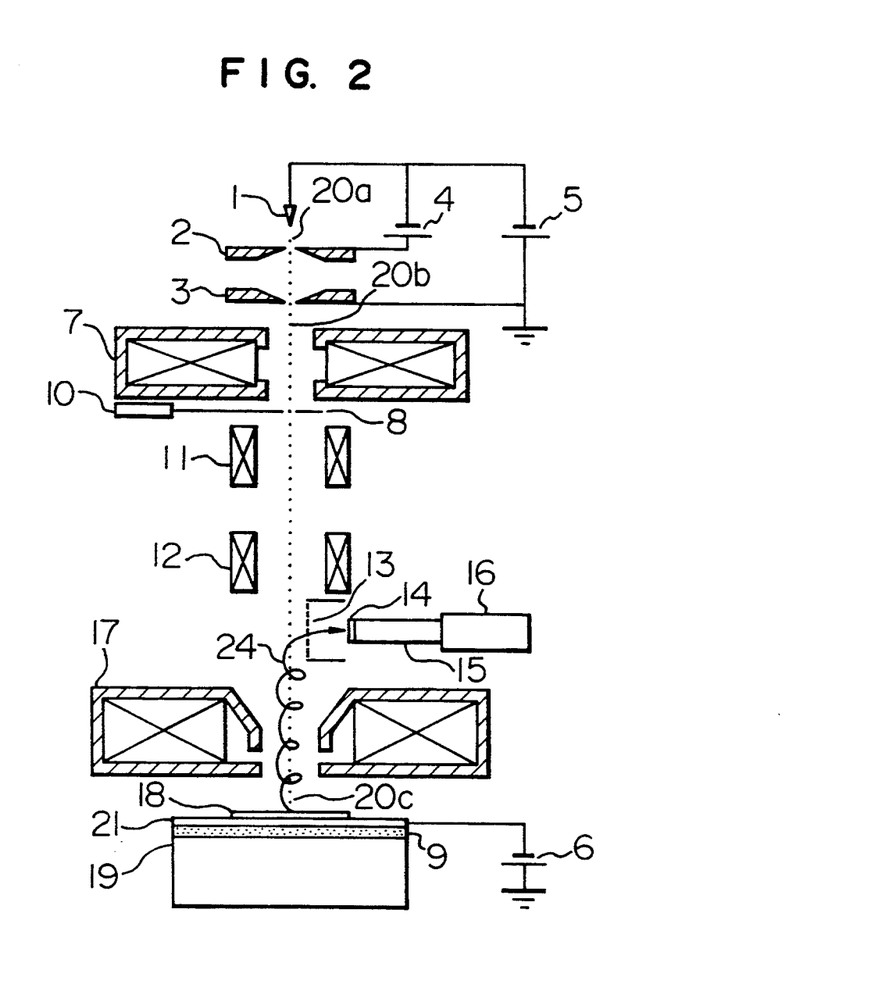
FIG. 2 is a schematic structural diagram of the scanning electron microscope unit shown in FIG. 1.

FIG. 1 is a schematic structural diagram of a scanning electron microscope system according to an embodiment of the invention. This microscope system is arranged by a scanning electron microscope main body 100 and a sample replacing mechanism 200. FIG. 2 schematically represents a structure of the scanning electron microscope main body 100 shown in FIG. 1.

In FIG. 2, a cathode 1, a draw-out electrode 2, and an anode 3 constitute a field-emission-type electron gun. A draw-out voltage 4 is applied between the cathode 1 and draw-out electrode 2, and an acceleration voltage 5 is applied to the cathode 1. An electron beam 20a emitted from the cathode 1 is further accelerated by the voltage applied between the draw-out electrode 2 and anode 3 biased at the ground potential.

As a result, energy (acceleration voltage) of the electron beam passing through the anode 3 coincides with the acceleration voltage 5. Since a voltage of a negative superimposed voltage source 6 is applied via a sample holder 21 to the sample 18, and a retarding static field is produced between an objective lens 17 and the sample 18, the acceleration voltage of the electron beam illuminated, or irradiated to the sample 18 is equal to a voltage obtained by subtracting the voltage of the negative superimposed voltage source 6 from the acceleration voltage 5.

The electron beam 20b accelerated as the result of passing through the anode 3 is focused onto the sample 18 by a condenser lens 7 and the objective lense 17. The electron beam passing through the objective lens 17 is decelerated by the retarding static field formed between the objective lens 17 and the sample 18, and reaches the sample 18 at energy corresponding to the voltage obtained by essentially subtracting the voltage of the superimposed voltage source 6 from the acceleration voltage.

The divergence angle of the electron beam at the objective lens 17 is determined by an aperture 8 set under the condenser lens 7. Centering of the aperture 8 is performed by operating an adjusting knob 10.

The accelerated electron beam 20b is deflected by an upper scanning coil 11 and a lower scanning coil 12. The focused electron beam 20c which has been decelerated by the retarding static field is scanned on the sample 18 in a raster-like fashion. In this embodiment, the scanning coils are arranged in two stages, so that the scanned electron beam always passes through the center of the objective lens 17.

The sample 18 is fixed by a sample holder 21, and the sample holder 21 is mounted via an insulating table 9 on a sample stage 19 whose position is adjustable along the horizontal direction and the like. The voltage of the superimposed voltage source 6 is applied to the sample holder 21.

Secondary electrons 24 emitted from the sample 18 to which the decelerated electron beam 20c is irradiated, are accelerated by the retarding static field produced between the objective lens 17 and the sample 18, and then are extracted within the objective lens 17, and furthermore are climbed up in a spiral motion while being influenced by the magnetic field of the objective lens 17.

The secondary electrons 24 passing through the objective lens 17 are absorbed by an extraction electrode 13 which is provided outside the electron beam path and between the objective lens 17 and the lower scanning coil 12, to which a positive potential is applied. Then, the secondary electrons 24 are extracted and accelerated by a scintillator 14 to which a positive potential of 10 KV is applied, so that the scintillator 14 is illuminated.

The emitted light is directed to a photomultiplier tube 16 by a light guide 15 and converted into electric signals. The output of the photomultiplier tube 16 is further amplified to serve as the brightness modulation input of a cathode ray tube. However, the diagram showing the process is not illustrated.

In accordance with the scanning electron microscope with such a structural arrangement, as described above, since energy of the electron beam 20b when passing through the condenser lens 7, the aperture 8, and the objective lens 17 is higher than that of the electron beam 20c at the final stage, chromatic aberration could be improved and higher resolution could be achieved, as compared with those of the conventional microscope system.

Moreover, since the primary electron beam irradiated to the sample is retarded or decelerated, thereby having low energy, the charging-up of the sample can be solved.

Concretely speaking, the beam diameter was 15 nm when only the acceleration voltage of 500 V was applied. To the contrary, the beam diameter could be advantageously 10 nm when the acceleration voltage of 1,000 V was superimposed with the superimposed voltage of 500 V.

In FIG. 1, the constructive elements such as the field emitting cathode 1, the draw-out electrode 2, the anode 3, the condenser lens 7, the objective lens 17, the sample 18, the sample holder 21, the insulating stage 9, and the sample stage 19, are contained within a vacuum chamber 61. It should be noted that the vacuum exhausting system is omitted from FIG. 1.

It should also be noted that under such a condition that the negative voltage is being applied to the sample 18, it must be avoided that the sample replacement by a sample replacing mechanism 77 and the vacuum chamber 61 are under atmospheric pressure. In other words, the voltage of the superimposed power source 6 may be applied only when the electron beam is scanned on the sample 18.

Therefore, according to the present invention, only when all of the following first to third conditions which are preparation operations for mounting/replacing the sample, are satisfied, such a control to close a switch S2 is performed in such a manner that the voltage of the superimposed voltage source 6 is applied to the sample 18. In the first condition, a switch S1 is closed to apply the acceleration voltage 5. In the second condition, both of a valve G1 and a valve G2, which are provided between the cathode 1 and the sample 18, are opened. In the third condition, a valve G3 for causing the sample to pass therethrough is closed when the sample 18 is mounted on the sample stage 19 by using the sample replacing mechanism 77.

The above-described control of the switch S2 is executed by way of a drive control apparatus 62. This drive control apparatus controls an overall operation of the scanning electron microscope system in accordance with operations of a CPU (central processing unit) 63. In particular, only a control operation of the switch S2 will now be explained.

Figure 3:
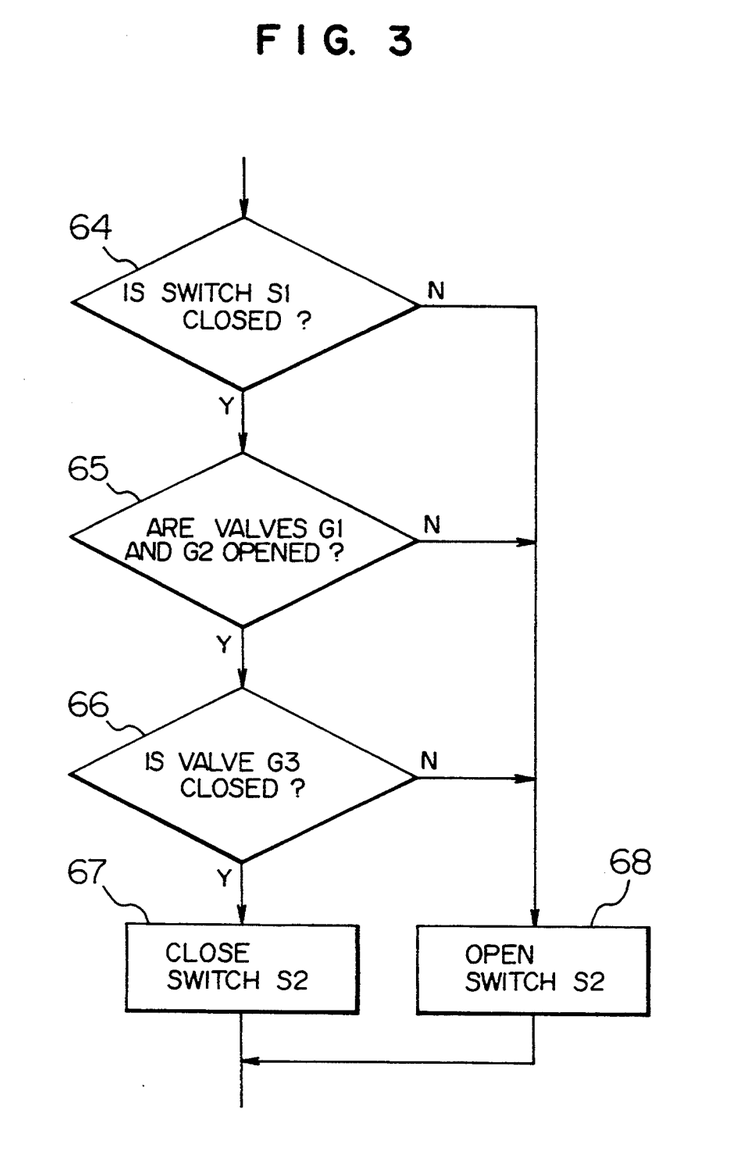
FIG. 3 is a flow chart for representing a major operation of the scanning electron microscope according to the present invention.

The drive control apparatus 62 drives to open and close the switches S1, S2 and the valves G1, G2, G3 respectively in accordance with an instruction issued from the CPU 63, and also confirms whether or not the drive control has been executed in response to the instruction. Here, the control operation to turn ON/OFF the switch S2 so as to apply the superimposed voltage is also performed in accordance with a flow chart shown in FIG. 3. First, a check is made as to whether or not the switch S1 for acceleration voltage is closed at a step S64. If the check result become YES, then another check is done as to whether or not the valves G1 and G2 provided on the electron beam path are opened at a step 65. At this step, if the check result becomes YES, then the control process is advanced to a step 66 at which a judgement is made as to whether or not the valve G3 provided on the path along which the sample is inserted and extracted, is closed. At this step, if the judgement result becomes YES, then since all of the above-described first, second and third conditions can be satisfied, the switch S2 for applying the superimposed voltage is closed the superimposed voltage to the sample. If even one judgement result becomes NO at the above-explained steps 64 to 66, then since any one of the three conditions cannot be satisfied, the switch S2 is opened at a step 68, so that no superimposed voltage is applied to the sample.

It should be noted that the sample holder 21 is electrically connected via a discharge resistor R to the sample stage 19, when the switch S2 is opened, the electrons charged on the sample 18 are quickly discharged through the sample holder 21, the discharge resistor R and the sample stage 19 under a preselected time constant, and thus the potential of the sample 18 become the ground potential.

It should also be noted that such a normal sequence that the valves G1 and G2 are opened either only when the acceleration voltage 5 is applicable under a certain condition that a vacuum degree around the cathode 1 is higher than a preset value, or only when a vacuum degree of the vacuum chamber 61 is higher than a preset value.

Although there has been described in this embodiment that when all of the above-explained three conditions could be satisfied, the superimposed voltage 6 was applied, when either one or two conditions among them can be satisfied, the switch S2 may be closed.

Figure 4:
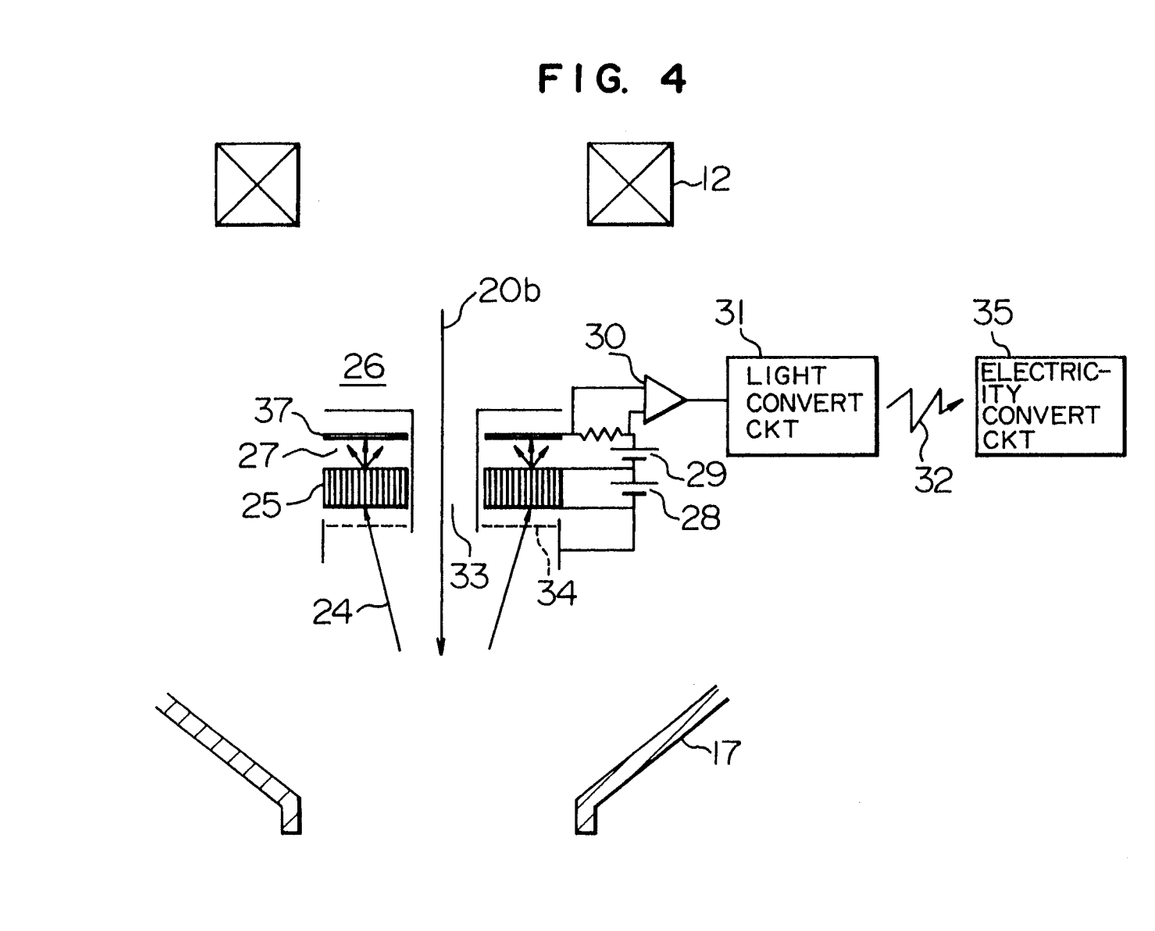
FIG. 4 is a schematic structural diagram of another scanning electron microscope unit according to a second embodiment of the present invention.

FIG. 4 is a schematic structural diagram for showing a secondary electron detecting unit of a scanning electron microscope according to a second embodiment of the present invention, in which the same symbols as those of the first embodiment represent the same or equivalent portions.

The first embodiment shown in FIG. 2 detects the secondary electrons 24 by directing them to the outside of the electron beam path by the absorbing electrode 13. However, in the second embodiment, the secondary electrons are detected by a multi-channel plate detector 26.

In this drawing, a disk-shaped multi-channel plate main body 25 having a central hole 33 is employed between the objective lens 17 and the lower scanning coil 12. A diameter of the central hole 33 is selected to be such a size that the electron beam 20b deflected by the lower scanning coil 12 does not collide with this central hole 33. A mesh 34 is provided under the multi-channel plate main body 25.

With such a structure, after the accelerated electron beam 20b has passed through the central hole 33 of the multi-channel plate main body 25, the electron beam 20b is focused by the objective lens 17 and then irradiated on the sample 18. The secondary electrons 24 emitted from the sample 18 undergo the lens-action of the objective lens 17, pass through the mesh 34 set on the front surface while diverging, and enter the multi-channel plate 25. The secondary electrons 24 having entered the multi-channel plate 25 are accelerated and amplified by an amplifying voltage 28 applied to both ends of the multi-channel plate 25. The amplified electrons 27 are further accelerated by the anode voltage 29 and captured by the anode 37.

After the captured secondary electrons have been amplified by an amplifier 30, they are converted into light by light converting circuit 31. The reason whey the secondary electrons are converted into the light 32, is such that the amplifier 30 is brought in a floating state due to the amplifying voltage 28 of the multi-channel plate 25, and so forth.

The light 32 is converted into electric signals again by an electricity converting circuit 35 for a ground potential and used as the brightness modulation signal for the scanning image. According to this method, only the secondary electrons but also the backscatterd electrons may be detected.

As apparent from the foregoing description, similar advantages to the previous embodiment can be achieved by this embodiment.

Figure 5:
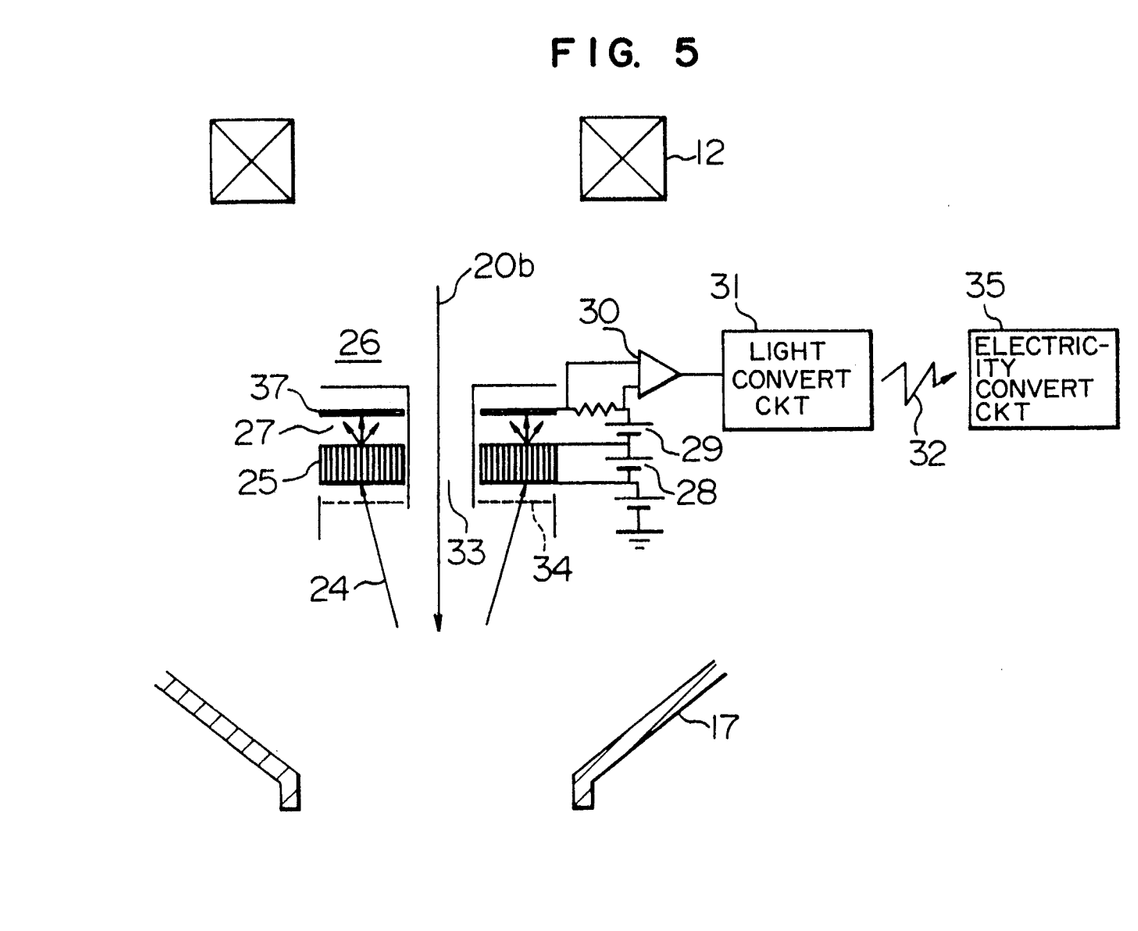
FIG. 5 is a schematic structural diagram of another scanning electron microscope unit according to a third embodiment of the present invention.

FIG. 5 is a schematic structural diagram for showing a secondary electron detecting unit of a scanning electron microscope according to a third embodiment of the present invention, in which the same symbols as those of the second embodiment represent the same or equivalent portions. The third embodiment is characterized in that desired secondary signals can be selectively detected.

In this drawing, a filtering voltage capable of optionally controlling the potential of the channel plate 25 is applied to the channel plate 25 from a power source 36. For example, when the filtering voltage from the power source 36 is assumed to be a negative voltage of approximately 10 V lower than the superimposed voltage from the power source 6, the secondary electrons among the secondary electrons and the backscatterd electrons emitted from a sample are repelled by an inverse electric field produced between the channel plate 25 and mesh 33, and only the backscatterd electrons having higher energy can be selectively detected.

It is also possible to find the potential of the sample by measuring the filtering voltage which is a limit for repelling secondary electrons. Thus, it is possible to inspect the functions of finished semiconductor devices by adding such a function.

Figure 6:
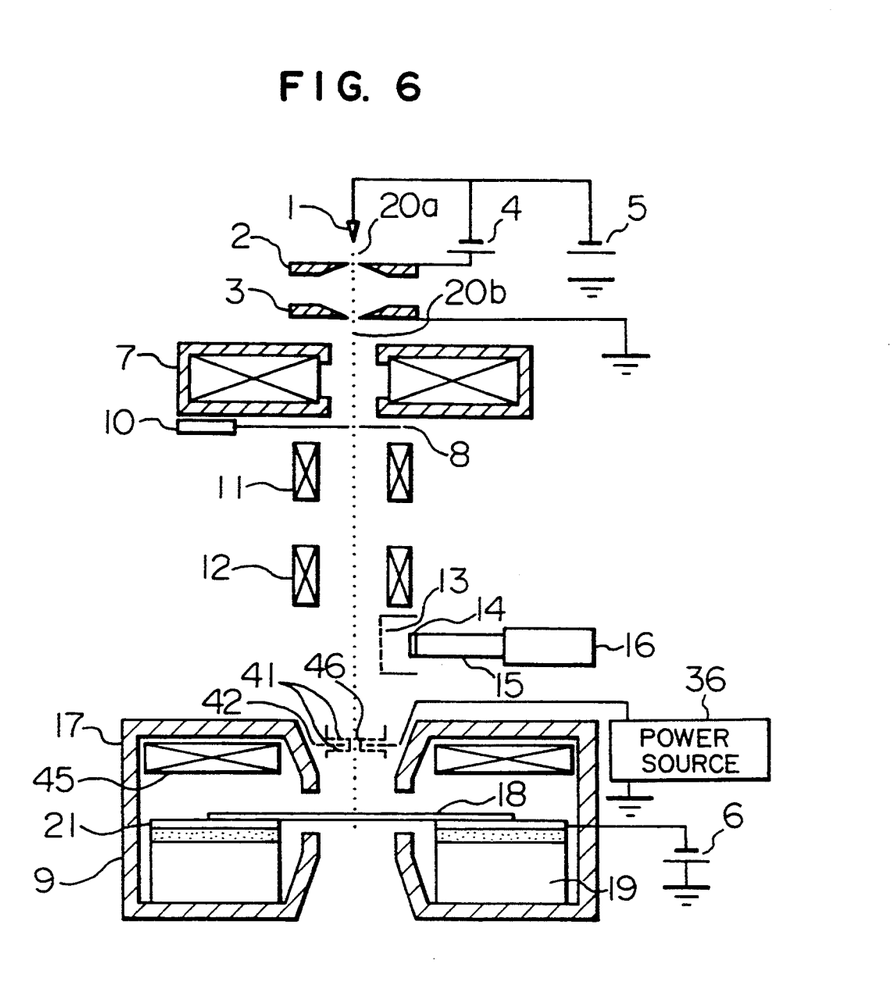
FIG. 6 is a schematic structural diagram of another scanning electron microscope unit according to a fourth embodiment of the present invention.

FIG. 6 is a schematic structural diagram for representing a secondary electron detecting unit of a scanning electron microscope according to a fourth embodiment of the present invention, in which the same reference numerals are employed as those for denoting the same or similar components. This embodiment is to provide an energy filter, namely a potential barrier above the objective lens 17. Especially, in accordance with the present embodiment, there is represented an in-lens method that the sample 18 is arranged within the objective lens 17.

The energy filter is constructed of a cylinder 46, one pair of shield grids 41, and a filtering grid 42. Similarly to the third embodiment in FIG. 4, this embodiment makes it possible to measure the potential of the sample 18 by controlling the filtering voltage to properly adjust the potential of the filtering grid 42.

Moreover, this embodiment makes it possible to selectively detect only secondary electrons without detecting backscatterd electrons by properly selecting the voltage of the extraction electrode 13.

In this in-lens system, the sample stage 19 is disposed inside the objective lens 17, an the sample 18 is fixed via the insulating stage 9 and the sample holder 21 to the sample stage 19. The superimposed voltage 6 is applied to a sample holder 21, and a retarding static field is produced between the sample 18 and the objective lens 17. An energizing coil 45 of the objective lens 17 is fixed on the upper portion of the objective lens 17. The objective 17 is large enough to house 8-inch wafers.

Figure 7:
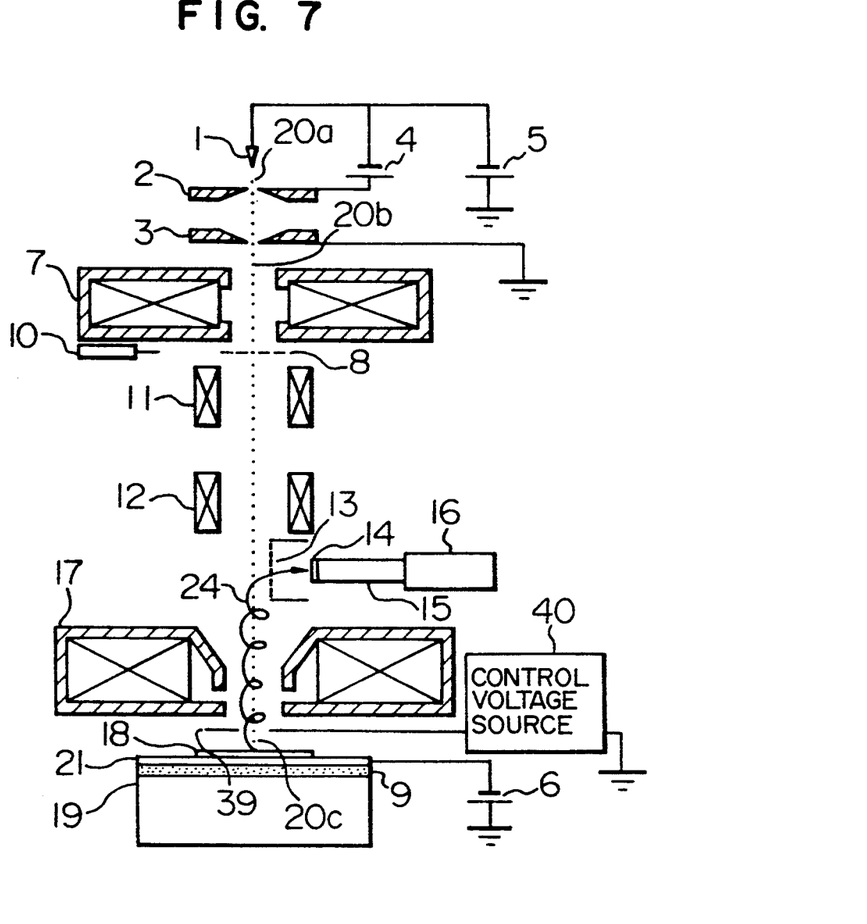
FIG. 7 is a schematic structural diagram of another scanning electron microscope unit according to a fifth embodiment of the present invention.

FIG. 7 is a schematic structural diagram for showing a secondary electron detecting unit of a scanning electron microscope according to a fifth embodiment of the present invention, in which the same symbols as those of the fourth embodiment represent the same or equivalent portions. This embodiment is capable of observing a sample which may be damaged if a strong electric field would be applied to it.

In semiconductor integrated circuits, an element may be broken down by a strong electric field. To solve the problem, this embodiment is provided with a control electrode 39 between the objective lens 17 and the sample 18 to apply several tens of voltage derived from a control voltage source 40 to the control electrode 39.

In accordance with this embodiment, the electric field produced between the objective lens 17 and the sample 18 is relaxed by way of the control electrode 39, so that it may prevent destruction of the element.

Figure 8:
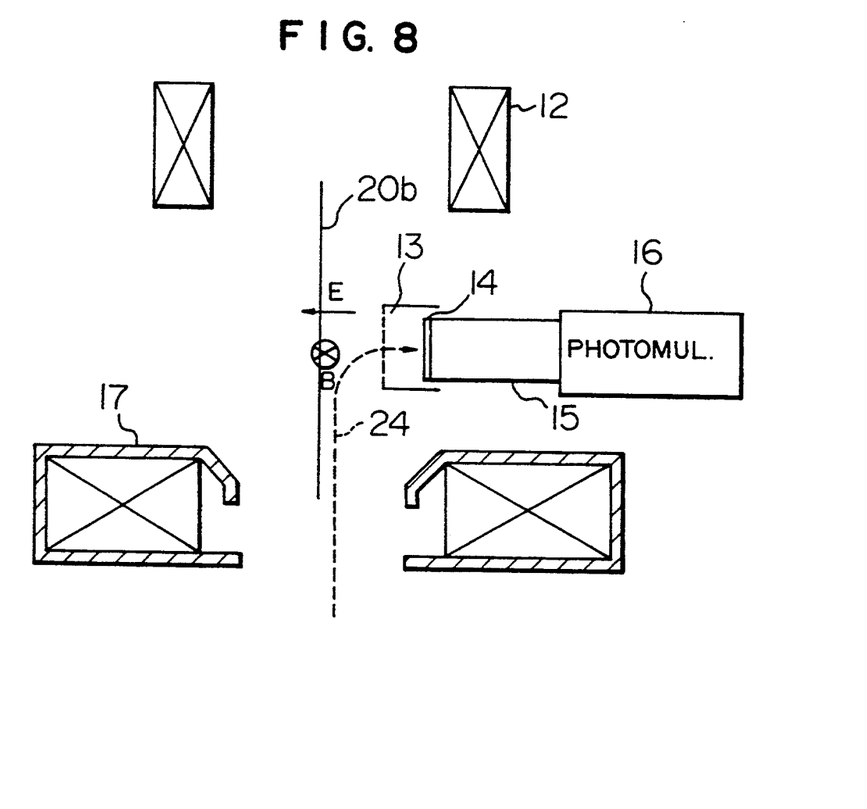
FIG. 8 is a schematic structural diagram of another scanning electron microscope unit according to a sixth embodiment of the present invention.

FIG. 8 is a schematic structural diagram for showing a secondary electron detecting unit of a scanning electron microscope according to a sixth embodiment of the present invention, in which the same symbols as those of the fifth embodiment represent the same or equivalent portions.

In the above-described first and fourth embodiments, the secondary signals are deflected by utilizing the electric field and then the deflected secondary signal is detected by the detector. In this embodiment, the secondary particles are deflected by utilizing the magnetic field and the electric field.

When the retarding voltage increases and then the energy difference between the primary electron beam 20b and the secondary electrons 24 emitted from the sample and accelerated by the retarding static field decreases. Therefore, an electric field "E" generated by the extraction electrode 13 for extracting the secondary electrons 24 bends not only the secondary electrons 24 but also the primary electron beam 20b.

The present embodiment solves this problem by taking account of such a fact that the direction of deflection of an electron beam due to a magnetic field "B" depends on progress direction of the electron beam deflection of the primary electron beam 20b due to the electric field "E" is canceled by the magnetic field "B" and the magnetic field supplements the deflection of the secondary electrons 24.

That is, this embodiment generates the magnetic field B in such a manner that the primary electron beam 22b is deflected in the direction opposite to the direction of deflection caused by the electric field E generated by the extraction electrode 13. Therefore, the deflection of the electron beam 22b due to the electric field E is canceled by properly controlling the magnitude of the magnetic field B.

On the other hand, because the direction of deflection of secondary electrons due to the magnetic field B is the same as that due to the electric field E, the deflection amount of the secondary electrons increases and the secondary electrons can be easily detected.

Figure 9:
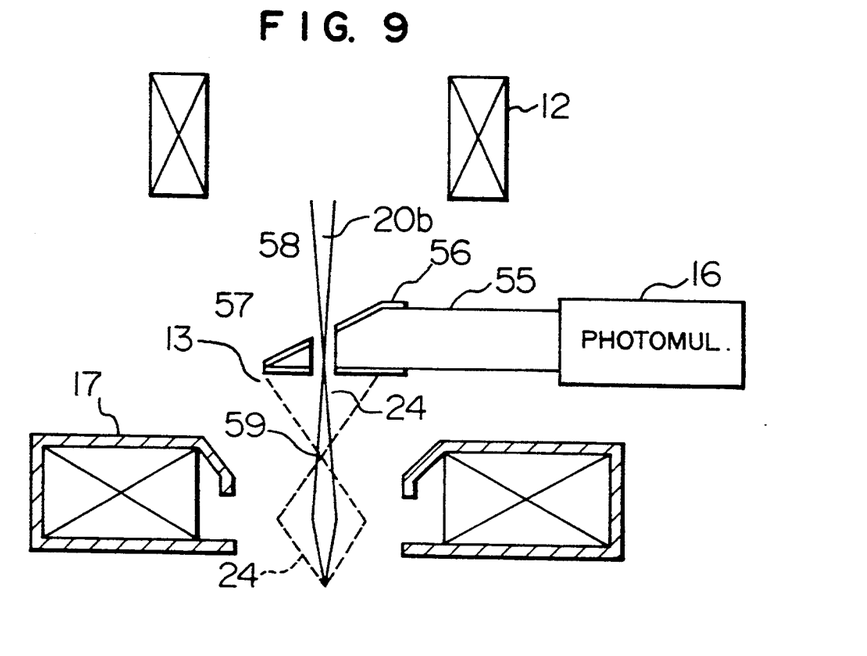
FIG. 9 is a schematic structural diagram of a further scanning electron microscope unit according to a seventh embodiment of the present invention.

FIG. 9 is a schematic structural diagram for showing a secondary electron detecting unit of a scanning electron microscope according to a seventh embodiment of the present invention, in which the same symbols as those of the sixth embodiment indicate the same or equivalent portions. In this embodiment, secondary signals are detected by utilizing a single crystal scintillator.

In this drawing, a single crystal scintillator 55 is constructed such that, for example, a cylindrical YAG single crystal is obliquely cut, an opening 57 for passing the primary electrons 20b is formed in the cut surface, the tip portion of the scintillator 55 is coated with a conductive thin film 56 made of metal or carbon, and the ground potential is given to the thin film 56.

In this embodiment, the crossover 58 of the primary electron beam 20b produced by the condenser lens 7 is positioned near the opening 57 and the crossover 59 of the secondary electrons 24 by the objective lens 17 is positioned apart from the opening 57. Accordingly, the secondary electrons 24 can be efficiently detected, while the primary electron beam 20b is not shielded by the opening 57.

It should be understood that the above seventh embodiment describes such that the light emitting portion of the scintillator and the light guide are arranged by the YAG single crystal. Alternatively, only the light emitting portion of the scintillator for detecting the secondary electrons may be formed by the YAG single crystal, and other portions thereof may be fabricated by such a transparent member as glass and resin.

Figure 10:
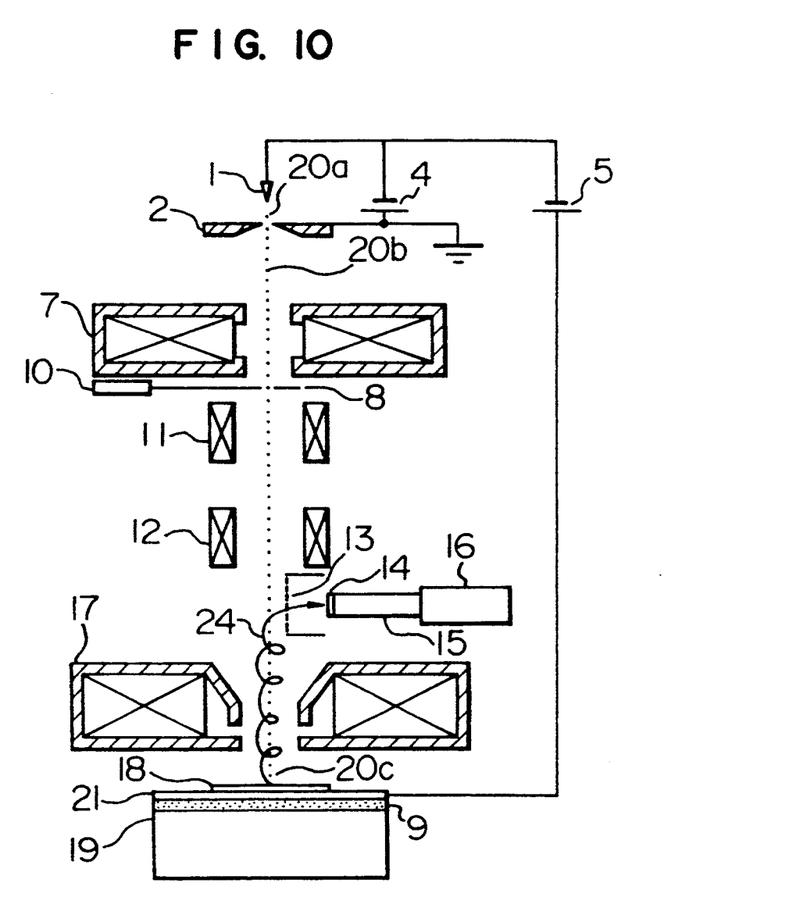
FIG. 10 is a schematic structural diagram of a still further scanning electron microscope unit according to an eighth embodiment of the present invention.

FIG. 10 is a schematic structural diagram for indicating a secondary electron detecting unit of a major portion of a scanning electron microscope according to an eighth embodiment of the present invention, in which the same symbols as those of the seventh embodiment represent the same or equivalent portions.

In this embodiment, an anode for constructing an electron gun is omitted, and an electron beam is accelerated by the draw-out voltage 4 applied between the draw-out electrode 2 connected to the ground potential and the cathode 1. The electrons accelerated by the draw-out voltage 4 are converged by the objective lens 17 and then are directed toward the sample 18. A positive polarity of the acceleration voltage source 5 is connected to the sample 18. At this time, since the voltage of the acceleration voltage source 5 is higher than the voltage of the draw-out voltage source 4 in the low acceleration voltage region, the electron beam is decelerated by the acceleration voltage 5 between the objective lens 17 and the sample 18 and then reaches the sample. In the typical example with employment of the field emission cathode, the draw-out voltage is 3 KV and the acceleration voltage is 1 KV. With such a structure, since both of the anode and the superimposed voltage source are omitted, the overall arrangement can be made simple.

As previously described in detail, in accordance with the present invention, in such a scanning electron microscope that the electron beams to be irradiated to the sample are decelerated by producing the retarding static field between the sample and the objective lens while applying the negative potential to the sample, whereby chromatic aberration is reduced and the charging-up is prevented, since the application of the negative potential is automatically controlled in conjunction with the preparation operation for mounting and replacing the sample, operators can mount and replace the sample without paying their specific attentions to the application of negative potential to the sample. As a consequence, the scanning electron microscope system can be very easily handled.

What is claimed is:

1. A scanning electron microscope wherein primary electron beams emitted from an electron source are scanned on a sample, and a scanning image is obtained from a detection signal produced by secondary particles generated from the sample, comprising:

secondary particle detecting means for detecting the secondary particles generated from a surface of the sample on the side of the electron source separated from an objective lens;

means for producing a retarding static field with respect to the primary electron beams between the sample and the objective lens by applying a negative voltage to the sample; and means for controlling an application of the negative voltage to the sample in conjunction with a preparation operation for mounting and replacing the sample.

2. A scanning electron microscope as claimed in claim 1, wherein said preparation operation corresponds to at least one of opening/closing operations for a sample transporting gate valve, opening/closing operations for gate valves employed in a vacuum chamber, and a control operation to apply an acceleration voltage.

3. A scanning electron microscope as claimed in claim 1, wherein said means for applying the negative voltage to the sample is constructed of:
a sample holder for fixing the sample;
a sample stage for mounting the sample holder via an insulating stage; and
means for applying the negative voltage to the sample holder.

4. A scanning electron microscope as claimed in claim 2, wherein said means for applying the negative voltage to the sample is constructed of:
a sample holder for fixing the sample;
a sample stage for mounting the sample holder via an insulating stage; and
means for applying the negative voltage to the sample holder.

5. A scanning electron microscope as claimed in claim 3, wherein said sample stage is grounded, and said sample holder is electrically connected via a discharge resistor to the sample stage.

6. A scanning electron microscope as claimed in claim 1, wherein said secondary particles detecting means includes a scintillator provided outside an electron beam path, and an extraction electrode to which a potential to extract the secondary particles is applied, is provided between said scintillator and said electron beam path.

7. A scanning electron microscope as claimed in claim 1, wherein said secondary particles detecting means is a multi-channel plate detector having an opening at a central portion thereof, which constitutes the electron beam path.

8. A scanning electron microscope as claimed in claim 1, wherein said secondary particles detecting means is a single crystal scintillator.

9. A scanning electron microscope as claimed in claim 6, further comprising:
potential barrier generating means provided between said sample and said secondary particles detecting means for generating a potential barrier used to select the secondary particles.

10. A scanning electron microscope as claimed in claim 7, further comprising:
potential barrier generating means provided between said sample and said secondary particles detecting means for generating a potential barrier used to select the secondary particles.

11. A scanning electron microscope as claimed in claim 1, further comprising:

a control electrode provided between said sample and said objective lens, for producing an electric field used to relax an influence of the electric field given to the sample.

12. A scanning electron microscope as claimed in claim 6, further comprising:

means for producing a magnetic field perpendicular to said extraction field, which acts to cancel deflection caused by said extraction field with respect to the primary electron beams, and acts to supplement the deflection caused by said extraction field with respect to the secondary particles emitted from the sample.

* * * * *